(12) United States Patent
Zhao

(10) Patent No.: US 11,315,821 B2
(45) Date of Patent: Apr. 26, 2022

(54) PROCESSING METHOD FOR WAFER

(71) Applicant: DISCO CORPORATION, Tokyo (JP)

(72) Inventor: Jinyan Zhao, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 126 days.

(21) Appl. No.: 17/004,441

(22) Filed: Aug. 27, 2020

(65) Prior Publication Data

US 2021/0066111 A1    Mar. 4, 2021

(30) Foreign Application Priority Data

Aug. 29, 2019  (JP) .............................. JP2019-157343

(51) Int. Cl.
| | | |
|---|---|---|
| *H01L 21/78* | (2006.01) | |
| *H01L 21/683* | (2006.01) | |
| *H01L 21/56* | (2006.01) | |
| *B23K 26/364* | (2014.01) | |
| *H01L 21/268* | (2006.01) | |
| *B81C 99/00* | (2010.01) | |

(52) U.S. Cl.
CPC ........ *H01L 21/6836* (2013.01); *B81C 99/008* (2013.01); *H01L 21/268* (2013.01); *H01L 21/78* (2013.01); *H01L 2221/68336* (2013.01)

(58) Field of Classification Search
CPC ............. H01L 21/7806; H01L 21/6836; H01L 21/67132; H01L 21/78–786
See application file for complete search history.

(56) References Cited

U.S. PATENT DOCUMENTS

| | | | | |
|---|---|---|---|---|
| 10,658,240 | B1* | 5/2020 | Iriguchi | .................. H01L 24/09 |
| 2007/0045799 | A1* | 3/2007 | Sekiya | ................ H01L 21/6838 |
| | | | | 438/118 |
| 2016/0104643 | A1* | 4/2016 | Yamashita | ........ H01L 21/02005 |
| | | | | 438/113 |

FOREIGN PATENT DOCUMENTS

| | | |
|---|---|---|
| JP | 2013229450 A | 11/2013 |
| JP | 2016076671 A | 5/2016 |

* cited by examiner

*Primary Examiner* — Brian Turner
(74) *Attorney, Agent, or Firm* — Greer Burns & Crain Ltd.

(57) ABSTRACT

A processing method for a wafer includes the steps of forming a frame unit having a ring-shaped frame, providing a resin sheet, fixing the resin sheet, which covers the wafer at its front side, at its outer peripheral edge, on the ring-shaped frame, forming through-holes in the resin sheet, holding the frame unit on a side of the resin sheet under suction on a holding surface to fix the ring-shaped frame, applying a laser beam to the wafer to form modified layers inside the wafer, and separating the resin sheet. In the holding step, the adhesive tape is suctioned under a negative pressure acting from the holding surface via through-holes while the front side of the wafer is prevented by the resin sheet from being suctioned on the holding surface.

15 Claims, 12 Drawing Sheets

PROCESSING METHOD FOR WAFER

BACKGROUND OF THE INVENTION

Field of the Invention

The present invention relates to a processing method for a wafer, especially to a processing method for a microelectromechanical systems (MEMS) device wafer.

Description of the Related Art

Processing that uses a laser beam is known to divide wafers of various shapes, each of which is made of silicon, gallium arsenide, silicon carbide (SiC), sapphire or the like and carries semiconductor devices formed thereon, into individual device chips. Processing of this sort applies, to a wafer, a laser beam of a wavelength having transmissivity through the wafer with a condensing point of the laser beam positioned inside the wafer, whereby modified layers are formed as fracture starting points inside the wafer. The wafer is fractured from the fracture staring points. This processing method enables dividing processing without use of water and need of substantially any cutting margin (see, for example, JP 2016-076671A and JP 2013-229450A).

SUMMARY OF THE INVENTION

For dividing what is generally called an MEMS device wafer, the devices formed on a front side of which are MEMS devices, into device chips, laser processing is suited for no potential damage to the MEMS devices, leading to the adoption of the above-mentioned processing method. If a test element group (TEG) or the like is included on a street, however, a laser beam cannot transmit through the TEG, thereby failing to suitably form a modified layer. According to the above-mentioned method, the laser beam is hence applied from a TEG-free back side of the wafer. In this case, the above-mentioned processing method requires to hold the wafer on the front side thereof, where the MEMS devices are formed, under suction by a chuck table, leading to potential damage to the MEMS devices.

With the foregoing in view, a technique was developed to apply a laser beam from a back side of a wafer while protecting MEMS devices, which are formed on a front side of the wafer, by using a protective sheet having gas permeability. With this technique, however, damage occurs on the MEMS devices due to a negative pressure acting on the MEMS devices across the protective sheet. With this technique, leakage is also prone to occur for the gas permeability of the protective sheet during suction by a chuck table, so that the wafer is not fixed firmly relative to the chuck table which moves at high speed, leading to a potential problem that, during processing, the wafer may vibrate or may move relative to the chuck table. Moreover, this technique also involves a potential problem that an adhesive layer of a dicing tape, which is bonded to the back side of the wafer and a ring-shaped frame, sticks to the chuck table to cause a transfer failure.

The present invention therefore has, as an object thereof, the provision of a processing method for a wafer which enables application of a laser beam from a back side of the wafer while preventing damage to devices formed on a front side of the wafer.

In accordance with an aspect of the present invention, there is provided a method for processing a wafer, on a front side of which devices are formed in a plurality of regions defined by intersecting streets. The method includes a frame unit forming step of bonding an adhesive tape to a ring-shaped frame centrally defining an opening, so that the opening is closed by the adhesive tape, and bonding the wafer at a back side of the wafer to the adhesive tape to form a frame unit, a resin sheet providing step of providing a resin sheet that has a diameter greater than that of the opening of the ring-shaped frame and will serve as a protective member for the wafer, a resin sheet fixing step of covering the opening of the ring-shaped frame with the resin sheet from the front side of the wafer in the frame unit and fixing, at an outer peripheral edge of the resin sheet, the resin sheet on the ring-shaped frame, the resin sheet facing the ring-shaped frame, a through-hole forming step of forming through-holes in a region of the resin sheet, the region being located on a radially outer side of an outer periphery of the wafer, a holding step of, after the resin sheet fixing step and the through-hole forming step, using a chuck table that includes a table main body having a holding surface of a diameter greater than that of the wafer and a frame-holding portion configured to pull the ring-shaped frame downward beyond the holding surface on a radially outer side of the table main body and to fix the ring-shaped frame there, and pulling the ring-shaped frame downward and fixing the ring-shaped frame there with the frame-holding portion while holding the frame unit on a side of the resin sheet of the frame unit under suction on the holding surface, a laser beam application step of, after the holding step, applying a laser beam of a wavelength, which has transmissivity through the adhesive tape and the wafer, to the wafer from a side of the adhesive tape with a condensing point thereof positioned inside the wafer, whereby modified layers are formed along the streets inside the wafer, and a resin sheet separation step of, after the laser beam application step, separating the resin sheet from the ring-shaped frame. In the holding step, the adhesive tape, which faces the resin sheet, is suctioned under a negative pressure acting from the holding surface via the through-holes of the resin sheet while the front side of the wafer is prevented by the resin sheet from being suctioned on the holding surface.

In the aspect of the present invention as described above, the devices on the wafer may be MEMS devices.

In the aspect of the present invention as described above, the method may further include a fracturing step of, after the resin sheet separation step, expanding the adhesive tape in a planar direction to fracture the wafer along the modified layers.

In the aspect of the present invention as described above, the adhesive tape may be bonded to the ring-shaped frame and the wafer, as adherends, via an ultraviolet (UV) light-curable adhesive layer, and the method may further include an ultraviolet light application step of, after the frame unit forming step but before the resin sheet fixing step, applying ultraviolet light to a region of the adhesive tape, the region being exposed between the ring-shaped frame and the wafer, whereby the adhesive layer is lowered in adhesive force.

In the aspect of the present invention as described above, in the resin sheet fixing step, the resin sheet may be fixed on the ring-shaped frame via an adhesive layer stacked on a region of the resin sheet, the region facing the ring-shaped frame.

In the aspect of the present invention as described above, in the resin sheet fixing step, the resin sheet may be heated at a region facing the ring-shaped frame, whereby the resin sheet is fixed in close contact with the ring-shaped frame.

According to the aspect of the present invention, a laser beam can be applied from the back side of the wafer while damage to the devices formed on the front side of the wafer is prevented.

The above and other objects, features and advantages of the present invention and the manner of realizing them will become more apparent, and the invention itself will best be understood from a study of the following description and appended claims with reference to the attached drawings showing preferred embodiments of the invention.

DETAILED DESCRIPTION OF THE PREFERRED EMBODIMENTS

With reference to the drawings, a description will be made in detail regarding embodiments for carrying out the present invention. However, the present invention should not be limited by details that will be described in the following embodiments. The elements of configurations that will hereinafter be described include those readily conceivable by persons skilled in the art and substantially the same ones. Further, the configurations that will hereinafter be described can be combined appropriately. Furthermore, various omissions, replacements, and modifications of configurations can be made in a range not departing from the spirit of the present invention.

First Embodiment

Figure 1:
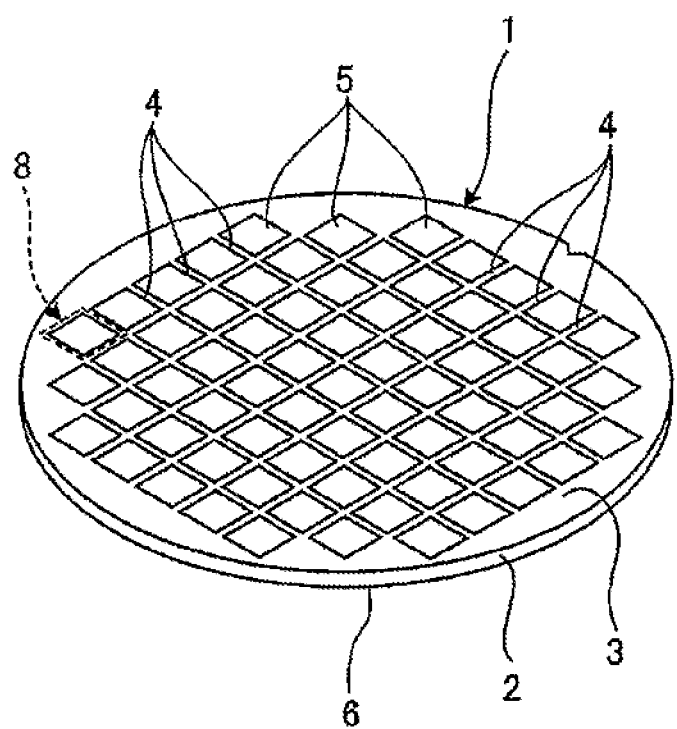
FIG. 1 is a perspective view depicting an example of a wafer as an object to be processed by a wafer processing method according to a first embodiment.
Figure 2:
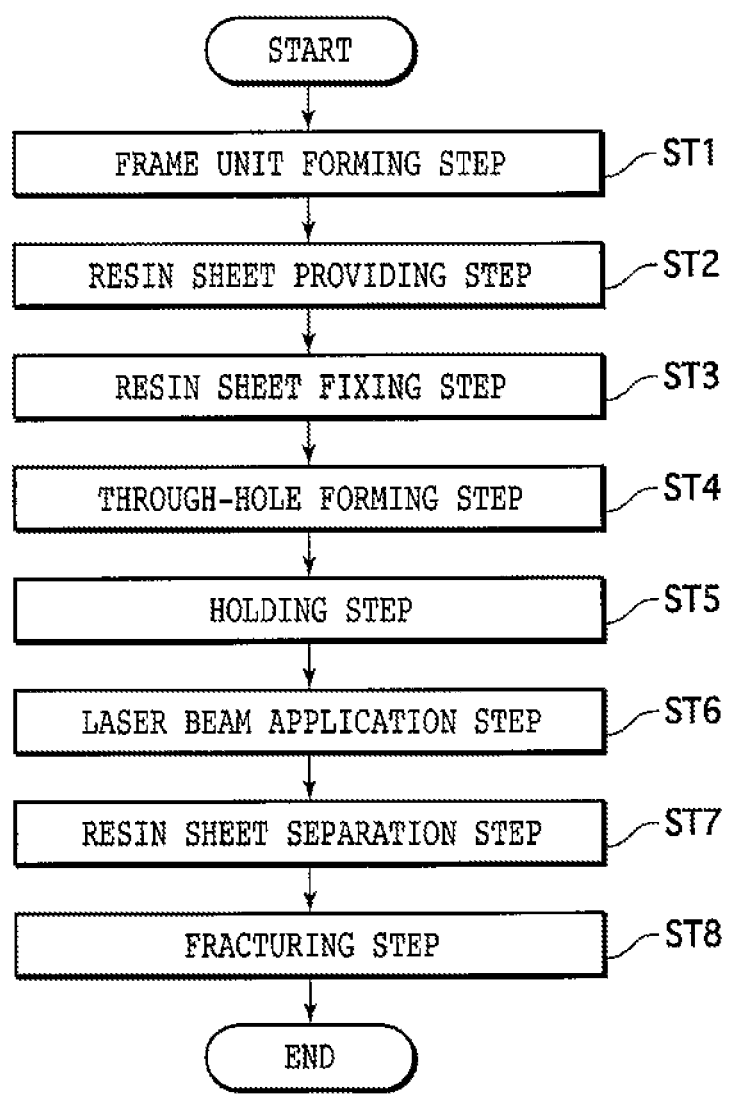
FIG. 2 is a flowchart illustrating a flow of the wafer processing method according to the first embodiment.

A processing method according to a first embodiment of the present invention for a wafer (hereinafter referred to as "the wafer processing method according to the first embodiment") will be described based on the relevant figures of the attached drawings. FIG. 1 is a perspective view depicting an example of a wafer 1 as an object to be processed by the wafer processing method according to the first embodiment. FIG. 2 is a flowchart illustrating a flow of the wafer processing method according to the first embodiment.

The wafer processing method according to the first embodiment divides the wafer 1, which is depicted in FIG. 1, into individual device chips 8. The wafer 1 to be processed by the wafer processing method according to the first embodiment is a disk-shaped wafer including a substrate 2 of silicon, sapphire, gallium arsenide, silicon carbide (SiC), or the like. As depicted in FIG. 1, the wafer 1 carries devices 5 formed in a plurality of regions, respectively, on a front side 3 of the substrate 2 as defined by intersecting streets 4. In the first embodiment, the devices 5 are MEMS devices. Therefore, the wafer 1 in the first embodiment is what is generally called an MEMS device wafer in which the devices 5 are MEMS devices. In the present invention, however, the devices 5 should not be limited to MEMS devices.

Further, the device chips 8 that are obtained by dividing the wafer 1 each include a portion of the substrate 2 and the corresponding device 5 formed on the front side 3 of the substrate 2.

The wafer processing method according to the first embodiment is a method for processing the wafer 1 and, as illustrated in FIG. 2, includes a frame unit forming step ST1, a resin sheet providing step ST2, a resin sheet fixing step ST3, a through-hole forming step ST4, a holding step ST5, a laser beam application step ST6, a resin sheet separation step ST7, and a fracturing step ST8.

(Frame Unit Forming Step)

Figure 3:
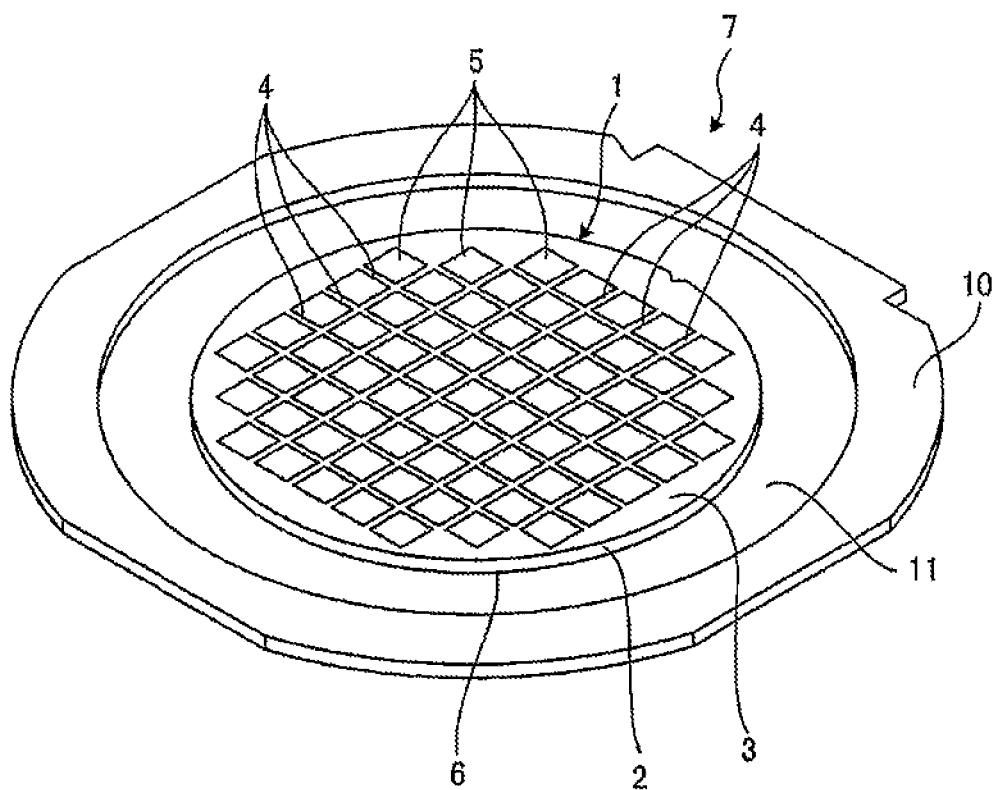
FIG. 3 is a perspective view of a frame unit formed in a frame unit forming step of the wafer processing method illustrated in FIG. 2.
Figure 4:
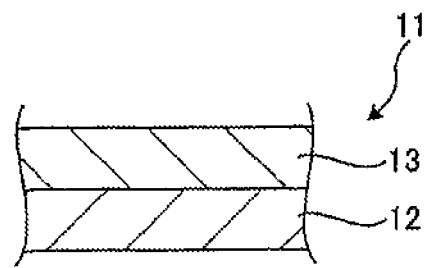
FIG. 4 is a fragmentary cross-sectional view of an adhesive tape in the frame unit depicted in FIG. 3.

FIG. 3 is a perspective view of a frame unit 7 formed in the frame unit forming step ST1 of the wafer processing method illustrated in FIG. 2. FIG. 4 is a fragmentary cross-sectional view of an adhesive tape 11 in the frame unit 7 depicted in FIG. 3. The frame unit forming step ST1 forms the frame unit 7 in which the wafer 1 is bonded at a back side 6 of the substrate 2 thereof to the adhesive tape 11 that closes an opening of a ring-shaped frame 10.

In the frame unit forming step ST1, as depicted in FIG. 3, the adhesive tape 11 that has a disk shape of a diameter greater than that of the wafer 1 and centrally defines an opening is bonded at an outer peripheral edge thereof to the ring-shaped frame 10, which centrally defines an opening, so that the opening is closed by the adhesive tape 11, and the back side 6 of the substrate 2 of the wafer 1 is bonded to a central portion of the adhesive tape 11 to form the frame unit 7. In the first embodiment, the adhesive tape 11 includes, as depicted in FIG. 4, a base material layer 12 formed with a synthetic resin that has flexibility and is gas impermeable and an adhesive layer 13 that is stacked on the base material layer 12 and has an adhesive force sufficient to bond to the ring-shaped frame 10 and the back side 6 of the wafer 1. It is to be noted that the ring-shaped frame 10 and the wafer 1 correspond to adherends to which the adhesive tape 11 is bonded.
(Resin Sheet Providing Step)

Figure 5:
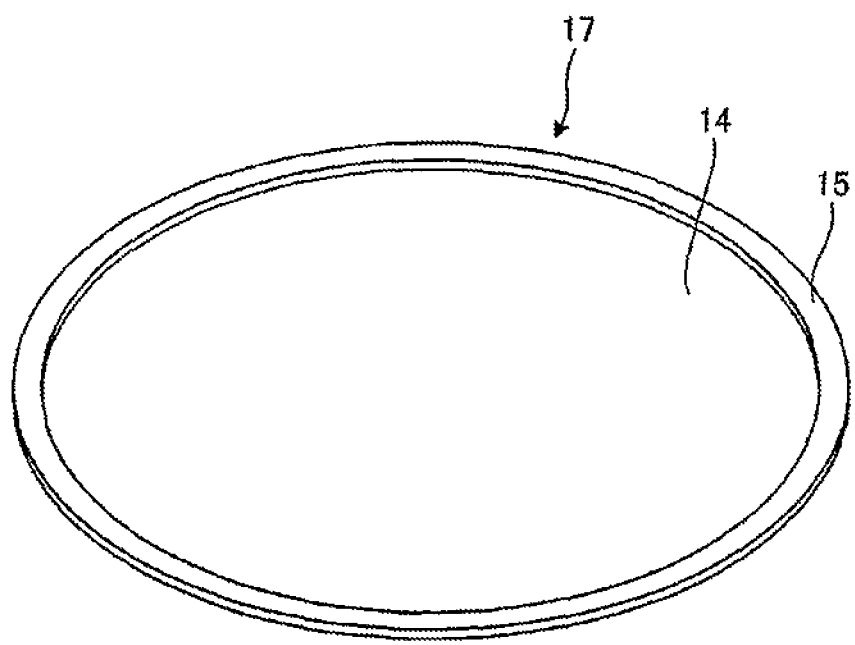
FIG. 5 is a perspective view of a resin sheet to be provided in a resin sheet providing step of the wafer processing method illustrated in FIG. 2.

FIG. 5 is a perspective view of a resin sheet 17 to be provided in the resin sheet providing step ST2 of the wafer processing method illustrated in FIG. 2. The resin sheet providing step ST2 provides the resin sheet 17 that has a diameter greater than that of the opening of the ring-shaped frame 10 and will serve as a protective member for the wafer 1.

In the resin sheet providing step ST2, the resin sheet 17 depicted in FIG. 5 and having the disk shape of the diameter greater than that of the wafer 1 is provided. In the first embodiment, the resin sheet 17 includes, as depicted in FIG. 5, a base material layer 14 formed with a synthetic resin that has flexibility and is gas impermeable and an adhesive layer 15 that is stacked on the base material layer 14 and has an adhesive force sufficient to bond to the ring-shaped frame 10. In the first embodiment, the adhesive layer 15 is stacked on an outer peripheral edge of the base material layer 14 of the resin sheet 17, the outer peripheral edge being a region facing the ring-shaped frame 10, over the entire periphery of the outer peripheral edge, but is not stacked on a remaining region of the base material layer 14 of the resin sheet 17, the remaining region facing the opening of the ring-shaped frame 10, which is located on a radially inner side of the inner peripheral edge.
(Resin Sheet Fixing Step)

Figure 6:
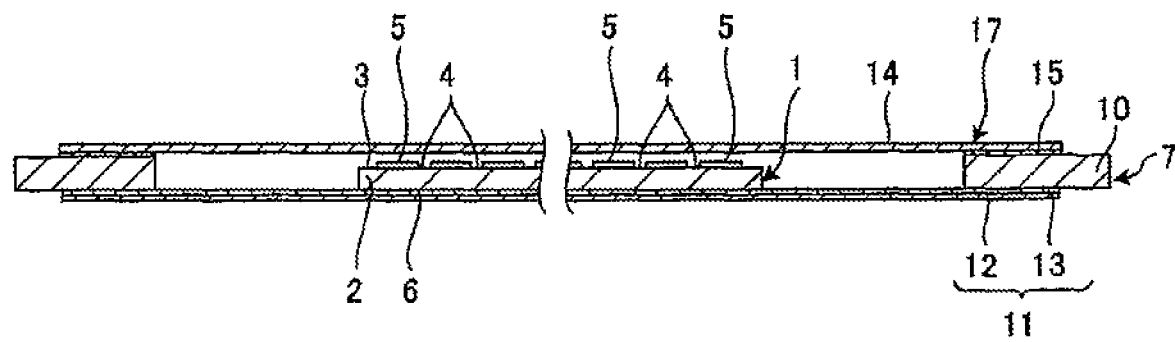
FIG. 6 is a cross-sectional view of the frame unit with the resin sheet fixed in a resin sheet fixing step of the wafer processing method illustrated in FIG. 2.

FIG. 6 is a cross-sectional view of the frame unit 7 with the resin sheet 17 fixed in the resin sheet fixing step ST3 of the wafer processing method illustrated in FIG. 2. The resin sheet fixing step ST3 covers the opening of the ring-shaped frame 10 with the resin sheet 17 from the front side 3 of the substrate 2 of the wafer 1 in the frame unit 7 and fixes the resin sheet 17 at the outer peripheral edge thereof, which faces the ring-shaped frame 10, on the ring-shaped frame 10.

In the resin sheet fixing step ST3, the adhesive layer 15 of the resin sheet 17 is positioned facing the ring-shaped frame 10, and the base material layer 14 is positioned facing the front side 3 of the substrate 2 of the wafer 1. As depicted in FIG. 6, the adhesive layer 15 is then bonded to the ring-shaped frame 10 so that the resin sheet 17 is fixed at the outer peripheral edge thereof on the ring-shaped frame 10. In the resin sheet fixing step ST3, the resin sheet 17 is therefore fixed on the ring-shaped frame 10 via the adhesive layer 15, whereby the devices 5 are covered by the base material layer 14 of the resin sheet 17, the base material layer 14 having no gas permeability, i.e., being gas impermeable, for the protection of the devices 5 on the wafer 1. Also, in the resin sheet fixing step ST3, the resin sheet 17 is therefore fixed on the ring-shaped frame 10 via the adhesive layer 15, whereby the adhesive layer 13 of the adhesive tape 11 is covered by the base material layer 14 of the resin sheet 17.
(Through-Hole Forming Step)

Figure 7:
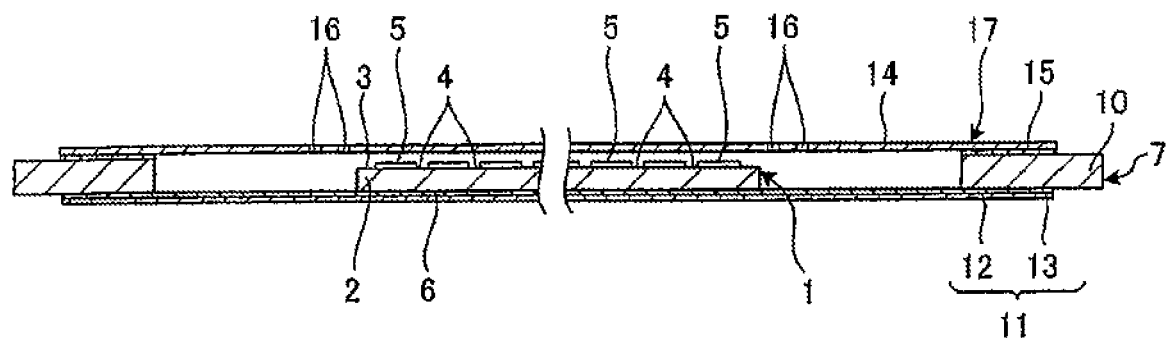
FIG. 7 is a cross-sectional view of the frame unit with through-holes formed in the resin sheet fixed on a ring-shaped frame in a through-hole forming step of the wafer processing method illustrated in FIG. 2.
Figure 8:
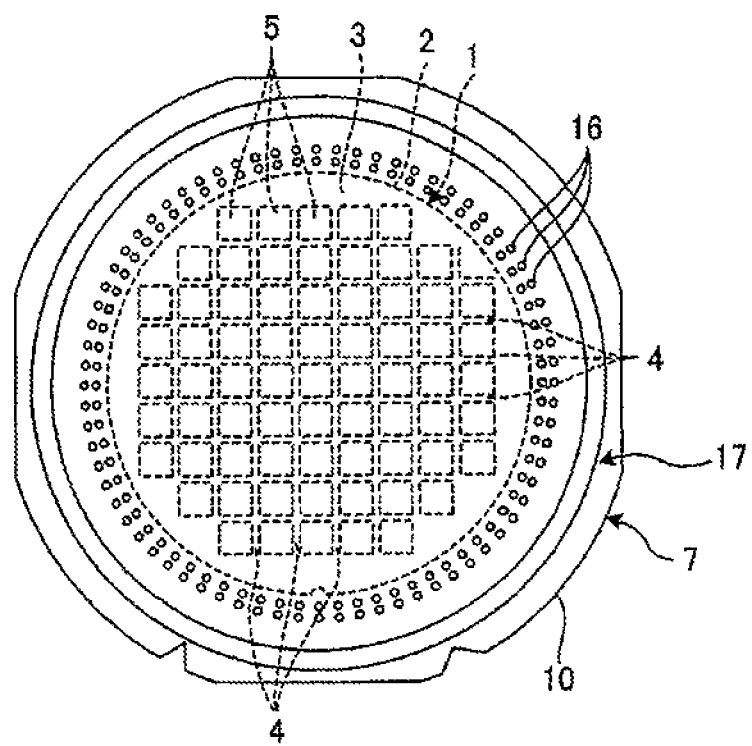
FIG. 8 is a plan view of the frame unit depicted in FIG. 7.

FIG. 7 is a cross-sectional view of the frame unit 7 with a plurality of through-holes 16 formed in the resin sheet 17 fixed on the ring-shaped frame 10 in the through-hole forming step ST4 of the wafer processing method illustrated in FIG. 2. FIG. 8 is a plan view of the frame unit 7 depicted in FIG. 7. The through-hole forming step ST4 forms the through-holes 16 in a region of the resin sheet 17, the region being located on a radially outer side of an outer periphery of the wafer 1.

In the through-hole forming step ST4, as depicted in FIGS. 7 and 8, the through-holes 16 are formed at intervals in a peripheral direction in the region of the resin sheet 17 bonded to the ring-shaped frame 10 via the adhesive layer 15, the region being located on the radially outer side of the outer periphery of the wafer 1. The through-holes 16 are holes extending through the base material layer 14 of the resin sheet 17 and are arranged over the entire periphery of the wafer 1. The through-holes 16 are formed by application of a laser beam having a wavelength absorbable to the base material layer 14 of the resin sheet 17 or by a known machining process. Further, as depicted in FIG. 8, the through-holes 16 are arranged side by side in pairs in the radial direction between an outer edge of the wafer 1 and an inner edge of the ring-shaped frame 10. In the present invention, the through-hole forming step ST4 may be performed in advance before the resin sheet fixing step ST3 if the through-hole forming step ST4 is performed after the resin sheet providing step ST2.
(Holding Step)

Figure 9:
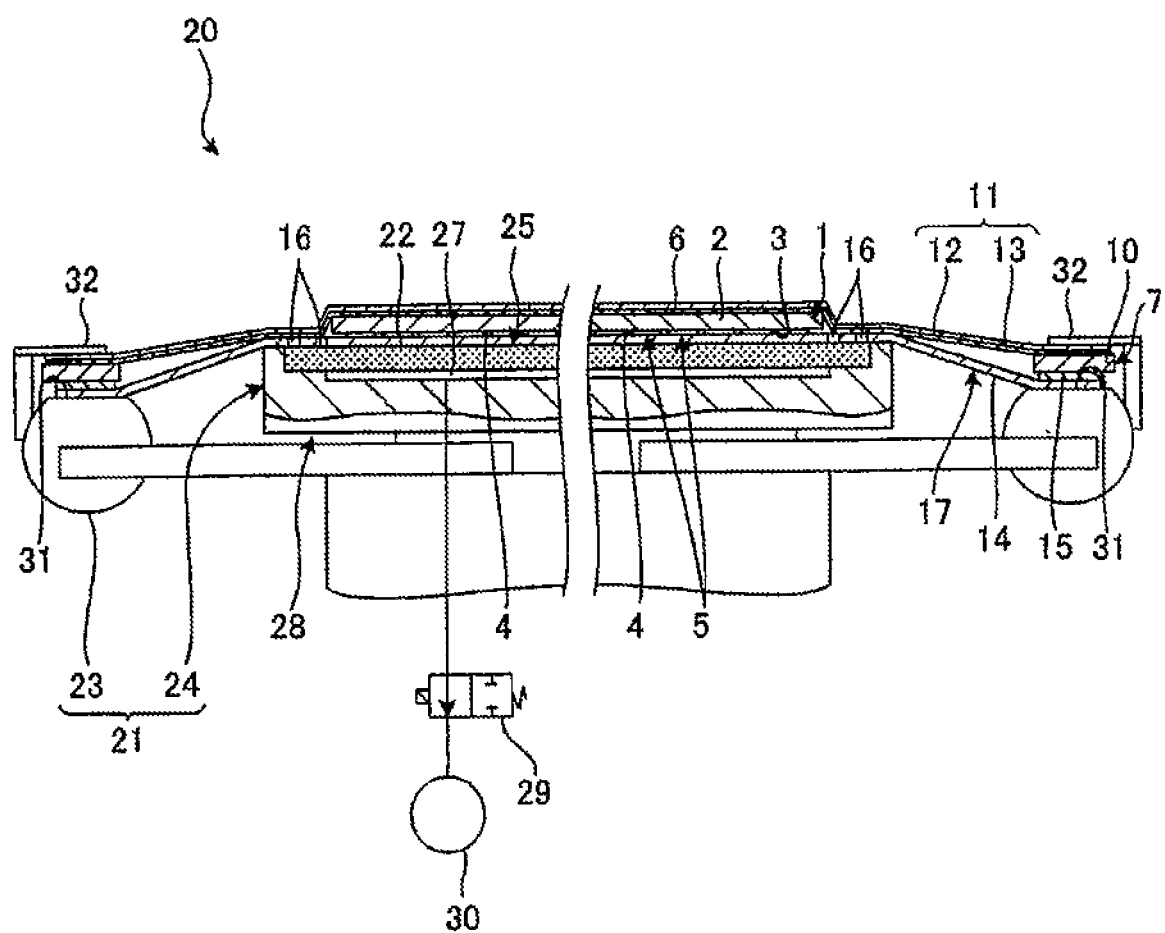
FIG. 9 is a cross-sectional view depicting a holding step of the wafer processing method illustrated in FIG. 2.

FIG. 9 is a cross-sectional view depicting the holding step ST5 of the wafer processing method illustrated in FIG. 2. After the resin sheet fixing step ST3 and the through-hole forming step ST4, the holding step ST5 uses a chuck table 21 of a laser processing apparatus 20 depicted in FIG. 9 to pull the ring-shaped frame 10 downward beyond the holding surface 22 of the chuck table 21 and fix the ring-shaped frame 10 there by a plurality of frame-holding portions 23 while holding the frame unit 7 on the side of the resin sheet 17 thereof under suction on the holding surface 22.

As depicted in FIG. 9, the chuck table 21 of the laser processing apparatus 20 includes a disk-shaped table main body 24 having the holding surface 22 of a diameter greater than that of the wafer 1, and the frame-holding portions 23 configured to pull the ring-shaped frame 10 downward beyond the holding surface 22 on a radially outer side of the table main body 24 and to fix the ring-shaped frame 10 there.

The table main body 24 includes a disk-shaped porous plate 25 and a disk-shaped frame member 28. The disk-shaped porous plate 25 has the holding surface 22 as its upper surface and is made of a porous material such as a porous ceramic. The disk-shaped frame member 28 centrally includes a recess 27, in which the porous plate 25 is fitted, in an upper wall thereof, and is made of a metal such as stainless steel. The upper surface of the frame member 28 is disposed on the same plane as the holding surface 22. The table main body 24 is connected at the recess 27 thereof to a suction source 30 via an on/off valve 29. When suctioned by the suction source 30, the table main body 24 holds the wafer 1 under suction on the holding surface 22 on which the wafer 1 is placed.

The frame-holding portions 23 are arranged at intervals on the radially outer side of the table main body 24. Each frame-holding portion 23 includes a mount surface 31 and a clamping member 32. The mount surface 31 is disposed at a height lower than the holding surface 22 and supports the ring-shaped frame 10 placed thereon. The clamping member 32 fixedly holds the ring-shaped frame 10 in cooperation with the mount surface 31.

In the holding step ST5, the wafer 1 is placed, at a front side 3 thereof, on the holding surface 22 via the resin sheet 17, the wafer 1 is held under suction on the holding surface 22 by the suction source 30, and the ring-shaped frame 10 is fixed by the frame-holding portions 23. As the base material layer 14 of the resin sheet 17 is made of the gas-impermeable synthetic resin, the front side 3 of the wafer 1 is prevented by the resin sheet 17 from being suctioned on the holding surface 22 in the holding step ST5.

Further, the through-holes 16 are disposed above the holding surface 22. In the holding step ST5, the adhesive tape 11, which faces the resin sheet 17, is thus suctioned by a negative pressure acting from the holding surface 22 via the through-holes 16 of the resin sheet 17, so that the gas between the resin sheet 17 and the adhesive tape 11 is evacuated to bring the resin sheet 17 and the adhesive tape 11 into close contact with each other on the holding surface 22. Therefore, the frame unit 7 is held under suction on the chuck table 21.

(Laser Beam Application Step)

Figure 10:
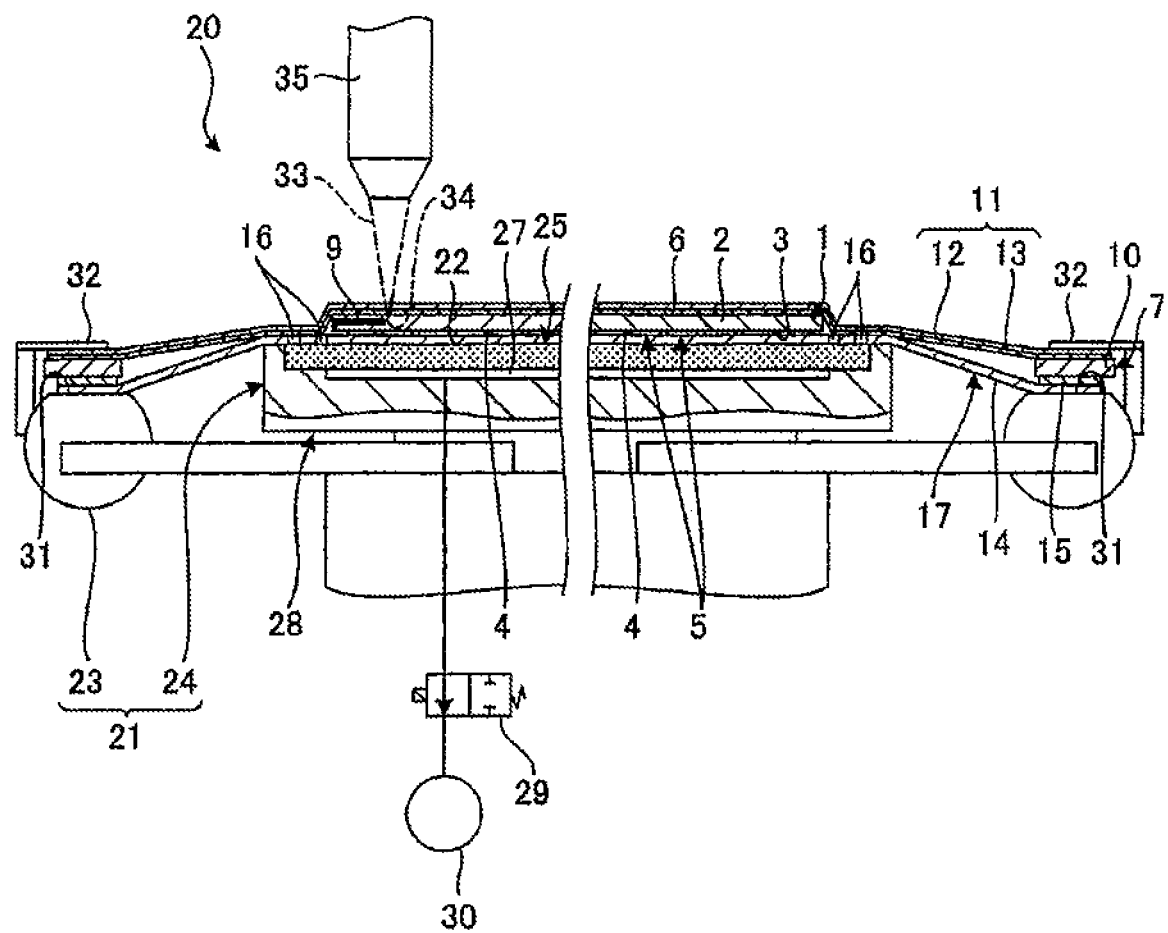
FIG. 10 is a cross-sectional view depicting a laser beam application step of the wafer processing method illustrated in FIG. 2.

FIG. 10 is a cross-sectional view depicting the laser beam application step ST6 of the wafer processing method illustrated in FIG. 2. After the holding step ST5, the laser beam application step ST6 applies a laser beam 33 of a wavelength which has transmissivity through the adhesive tape 11 and the wafer 1 to the wafer 1 from a side of the adhesive tape 11 with a condensing point 34 thereof positioned inside the substrate 2 of the wafer 1, whereby modified layers 9 are formed along the streets 4 inside the wafer 1.

It is to be noted that the term "modified layer" as used herein means a region where its density, refractive index, mechanical strength, and other physical characteristics have been made different from those of its surrounding region or regions. A fusion-treated region, a cracked region, an electrical breakdown region, a refractive index change region, a region including two or more of such regions together, or a like region can be exemplified. In the first embodiment, the modified layers 9 have lower mechanical strength than the remaining portions of the substrate 2 of the wafer 1.

In the laser beam application step ST6, the laser beam 33 of the wavelength which has transmissivity through the wafer 1 and the adhesive tape 11 is applied from a laser beam application unit 35 to the streets 4 from the back side 6 of the wafer 1, with the condensing point 34 of the laser beam 33 being set inside the substrate 2, as depicted in FIG. 10, while the chuck table 21 and the laser beam application unit 34 are sequentially moved relative to each other along the streets 4. It is to be noted that, in the laser beam application step ST6, the laser beam 33 is applied to a predetermined position, specifically, a widthwise center of each street 4, and a laser beam generated by yttrium aluminum garnet (YAG) laser having a wavelength of 1,064 nm or 1,342 nm is used as the laser beam 33.

In the laser beam application step ST6, the modified layers 9 are formed along the streets 4 inside the substrate 2 because the laser beam 33 has the wavelength having transmissivity through the wafer 1 and the adhesive tape 11. When the modified layers 9 have been formed along all the streets 4 inside the substrate 2 in the laser beam application step ST6, the laser processing apparatus 20 then stops the application of the laser beam 33 and cancels the holding of the frame unit 7 under suction by the chuck table 21 and the fixing of the ring-shaped frame 10 by the frame holding portions 23.

(Resin Sheet Separation Step)

Figure 11:
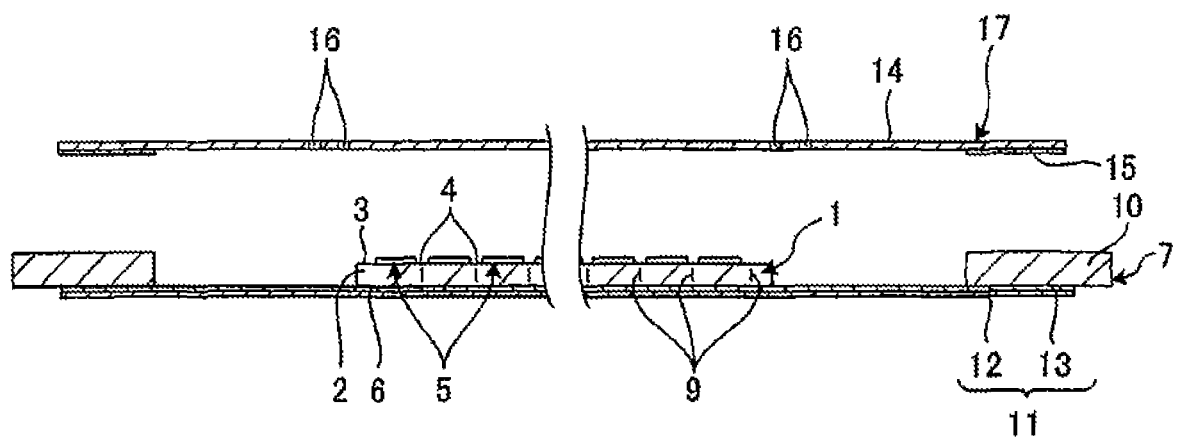
FIG. 11 is a cross-sectional view depicting a resin sheet separation step of the wafer processing method illustrated in FIG. 2.

FIG. 11 is a cross-sectional view depicting the resin sheet separation step ST7 of the wafer processing method illustrated in FIG. 2. After the laser beam application step ST6, the resin sheet separation step ST7 separates the resin sheet 17 from the ring-shaped frame 10.

In the resin sheet separation step ST7, from the ring-shaped frame 10 that holds thereon the wafer 1 with the modified layers 9 formed along the streets 4 inside the substrate 2, the adhesive layer 15 is separated as depicted in FIG. 11 so that the resin sheet 17 is separated from the ring-shaped frame 10.

(Fracturing Step)

Figure 12:
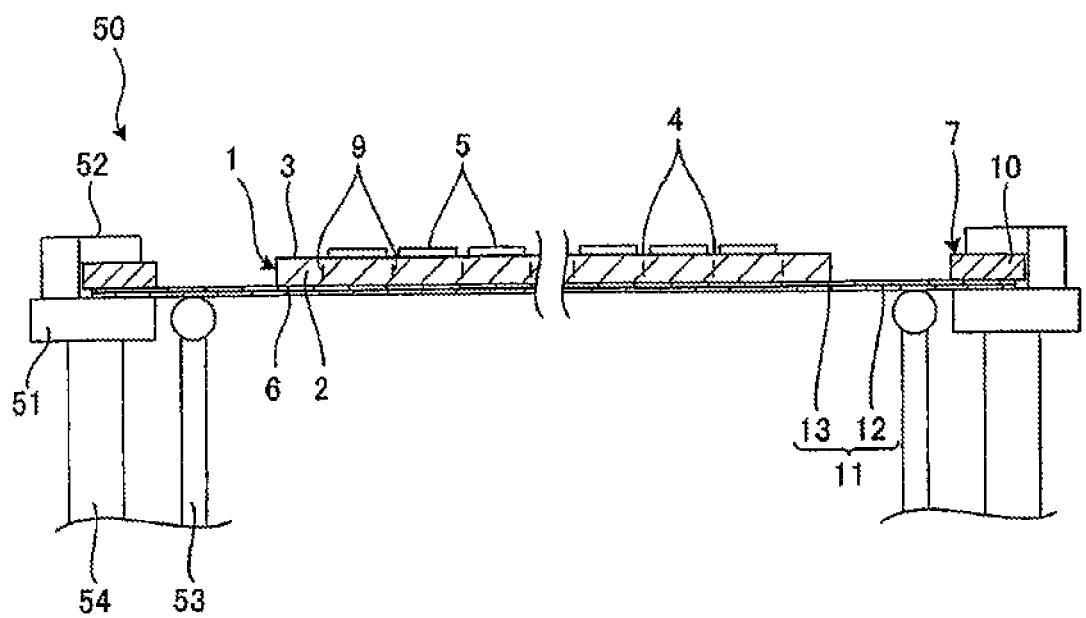
FIG. 12 is a cross-sectional view depicting the wafer held on an expansion apparatus in a fracturing step of the wafer processing method illustrated in FIG. 2.
Figure 13:
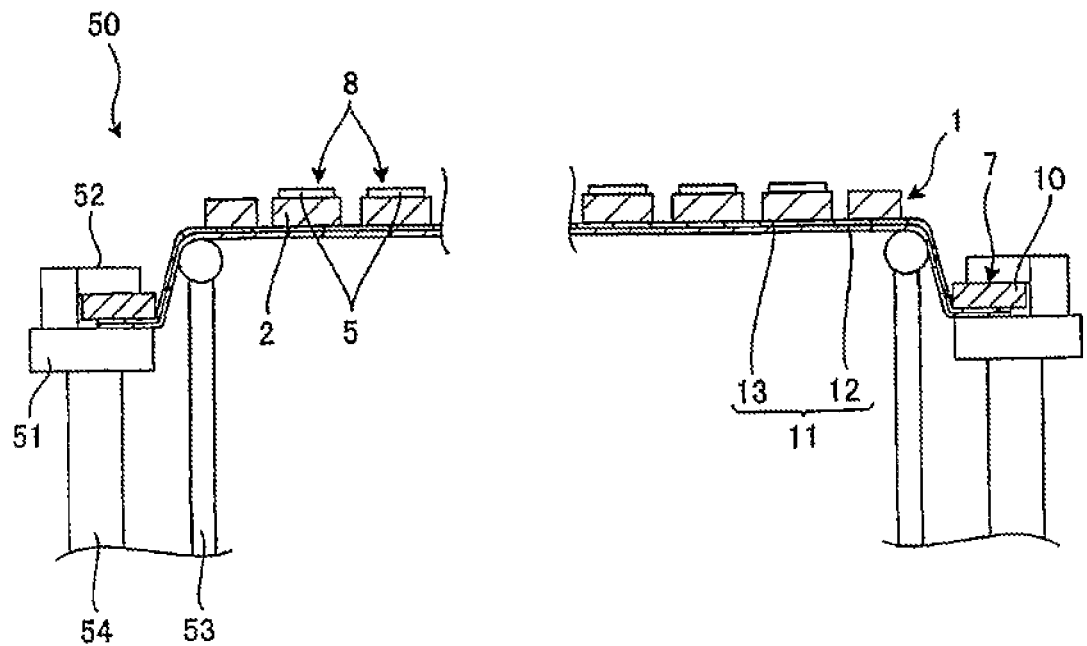
FIG. 13 is a cross-sectional view similar to FIG. 12, but depicting the adhesive tape expanded in the fracturing step.

FIG. 12 is a cross-sectional view depicting the wafer 1 held on an expansion apparatus 50 in the fracturing step ST8 of the wafer processing method illustrated in FIG. 2. FIG. 13 is a cross-sectional view similar to FIG. 12 but depicts the adhesive tape 11 expanded in the fracturing step ST8 of the processing method illustrated in FIG. 2. After the resin sheet separation step ST7, the fracturing step ST8 expands the adhesive tape 11 in a planar direction to fracture the wafer 1 along the modified layers 9 into the individual device chips 8.

In the fracturing step ST8, the ring-shaped frame 10 is placed on a frame-mounting ring-shaped plate 51 of the expansion apparatus 50 with the adhesive tape 11 interposed therebetween, and the expansion apparatus 50 clamps, at clamping portions 52 thereof, the ring-shaped frame 10 placed on the frame-mounting ring-shaped plate 51 as depicted in FIG. 12. At this time, the expansion apparatus 50 positions an upper-end peripheral edge of an expanding drum 53 and a ring-shaped surface of the frame-mounting ring-shaped plate 51 on the same plane to bring the upper-end peripheral edge of the expanding drum 53 into contact with the adhesive tape 11.

In the fracturing step ST8, the expansion apparatus 50 lowers the frame-mounting ring-shaped plate 51, i.e., the ring-shaped frame 10, by lift cylinders 54 as depicted in FIG. 13, whereby the ring-shaped frame 10 bonded on an outer peripheral edge of the adhesive tape 11 and the wafer 1 are moved relative to each other in a thickness direction thereof. As the upper-end peripheral edge of the expanding drum 53 comes into contact with the adhesive tape 11, the adhesive tape 11 is then expanded in the planar direction so that a radial tensile force acts on the adhesive tape 11.

When the tensile force radially acts on the adhesive tape 11 bonded on the back side 6 of the substrate 2 of the wafer 1, the wafer 1 fractures from the modified layers 9 as fracture starting points and is divided into the individual device chips 8 as depicted in FIG. 13 because the modified layers 9 have been formed along the streets 4 in the laser beam application step ST6. In the first embodiment, the frame-mounting ring-shaped plate 51 is lowered to expand the adhesive tape 11 in the fracturing step ST8. However, the present invention is not limited to such an operation mode, and the expanding drum 53 may be raised. In short, it is necessary to raise the expanding drum 53 relative to the frame-mounting ring-shaped plate 51 so that the frame-mounting ring-shaped plate 51 is lowered relative to the expanding drum 53.

When the wafer 1 has been divided into the individual device chips 8 in the fracturing step ST8, the processing method for the wafer 1 ends. The individually divided device chips 8 are picked up from the adhesive tape 11 by a known pick-up apparatus.

As has been described above, the wafer processing method according to the first embodiment covers the devices 5 by the base material layer 14 of the resin sheet 17, the base material layer 14 having no gas permeability, i.e., being gas impermeable, for the protection of the devices 5 on the wafer 1, whereby the front side 3 of the wafer 1, i.e., the devices 5, are prevented by the base material layer 14 of the resin sheet 17 from being suctioned toward and held on the holding surface 22. As a consequence, the wafer processing method according to the first embodiment can prevent the devices 5 from being suctioned and held on the holding surface 22 by a negative pressure acting from the holding surface 22 of the chuck table 21 and can therefore suppress damage to the devices 5 even if the devices 5 are MEMS devices.

In addition, according to the wafer processing method, the through-holes 16 are formed in the region of the resin sheet 17, the region being located on the radially outer side of the outer periphery of the wafer 1, whereby, under the negative pressure acting from the holding surface 22 of the chuck table 21, the gas between the resin sheet 17 and the adhesive tape 11 is evacuated via the through-holes 16. Accordingly, the adhesive tape 11 can be held under suction by the negative pressure acting via the through-holes 16, so that the wafer 1 can be held between the adhesive tape 11 and the resin sheet 17 and can be fixed relative to the chuck table 21. As a consequence, the processing method for the wafer 1 can prevent the wafer 1 from moving relative to the chuck table 21 during the application of the laser beam 33 despite the base material layer 14 of the resin sheet 17 placed on the holding surface 22 having gas impermeability. Therefore, the wafer processing method according the first embodiment exhibits an advantageous effect that the laser beam 33 can be applied from the back side 6 of the wafer 1 while damage to the devices 5 is prevented.

Moreover, the adhesive layer 13 of the adhesive tape 11 is covered by the base material layer 14 of the resin sheet 17. Therefore, the wafer processing method according the first embodiment can also exhibit another advantageous effect that the adhesive tape 11 does not stick to the chuck table 21, thereby preventing residues of the adhesive layer 13 from remaining on the chuck table 21 or preventing a transfer failure.

Second Embodiment

Figure 14:
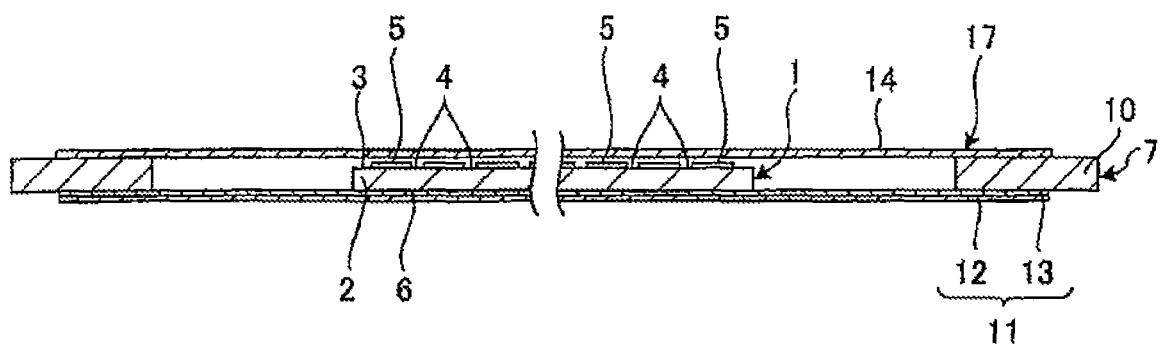
FIG. 14 is a cross-sectional view of the frame unit with a resin sheet fixed in the resin sheet fixing step of a wafer processing method according to a second embodiment.

A processing method according to a second embodiment of the present invention for a wafer (hereinafter referred to as "the wafer processing method according to the second embodiment) will be described based on the relevant figure of the attached drawings. FIG. 14 is a cross-sectional view of the frame unit 7 with a resin sheet 17 fixed in a resin sheet fixing step ST3 of the wafer processing method according to the second embodiment. In FIG. 14, the same elements of configurations as in the first embodiment are identified by the same reference numerals, and their description is omitted herein.

The wafer processing method according to the second embodiment is the same as that of the first embodiment except that the resin sheet 17 does not have the adhesive layer 15 but includes only the base material layer 14 and that the resin sheet fixing step ST3 is different.

In the resin sheet fixing step ST3 of the wafer processing method according to the second embodiment, the base material layer 14 of the resin sheet 17 is heated at the outer peripheral edge thereof, the outer peripheral edge being the region facing the ring-shaped frame 10, and, as depicted in FIG. 14, the outer peripheral edge is fixed in close contact with the ring-shaped frame 10 so that the resin sheet 17 is fixed in close contact with the ring-shaped frame 10.

The wafer processing method according to the second embodiment covers the devices 5 by the base material layer 14 of the resin sheet 17, the base material layer 14 being gas impermeable, for the protection of the devices 5 on the wafer 1, thereby preventing the devices 5 from being held under suction on the holding surface 22 by a negative pressure acting from the holding surface 22 of the chuck table 21. Further, the wafer processing method according to the second embodiment evacuates, via the through-holes 16, the gas between the resin sheet 17 and the adhesive tape 11, thereby fixing the wafer 1 relative to the chuck table 21. As a consequence, the wafer processing method according to the second embodiment, similarly to the first embodiment, brings about the advantageous effect that the laser beam 33 can be applied from the back side 6 of the wafer 1 while damage to the devices 5 is prevented.

Furthermore, the wafer processing method according to the second embodiment also exhibits the effect that residues of the adhesive layer 15 can be prevented from remaining on the ring-shaped frame 10, because the resin sheet 17 does not have the adhesive layer 15. Moreover, the wafer processing method according to the second embodiment also exhibits a still further advantageous effect that the resin sheet 17 can easily be separated in the resin sheet separation step ST7, because there is no potential problem of bonding that would otherwise take place between the adhesive tape 11 and the adhesive layer 15 of the resin sheet 17.

Third Embodiment

Figure 15:
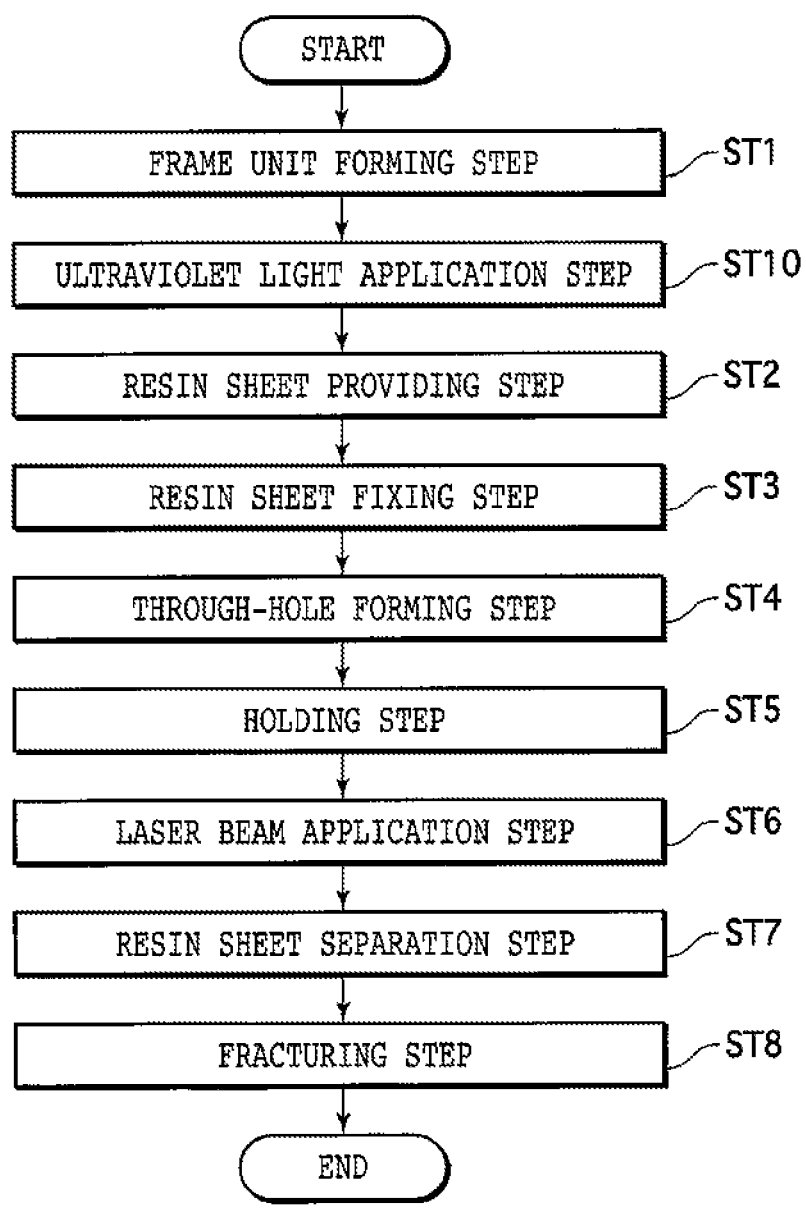
FIG. 15 is a flowchart illustrating a flow of a wafer processing method according to a third embodiment.
Figure 16:
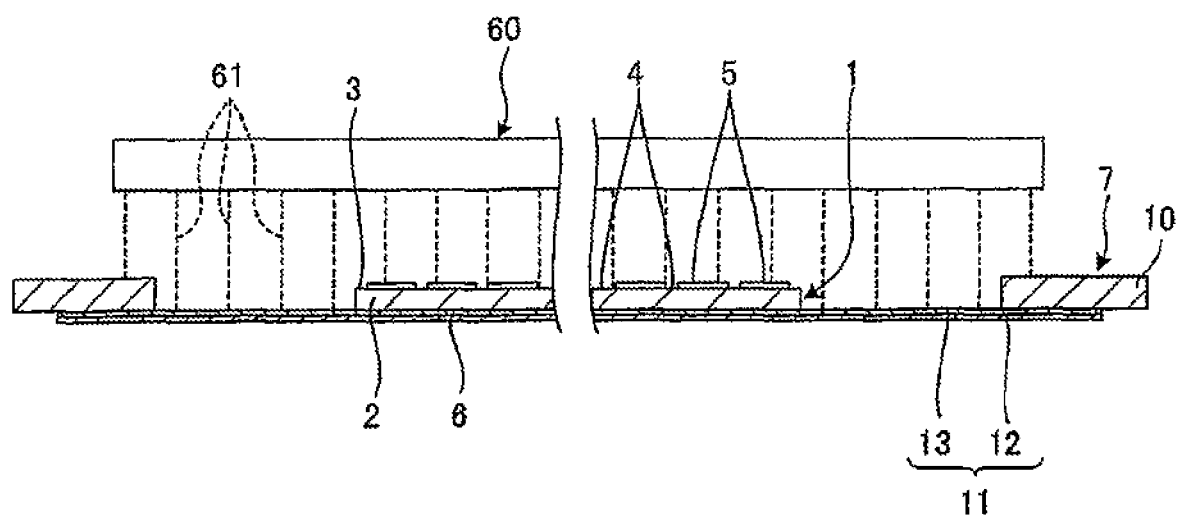
FIG. 16 depicts an ultraviolet light application step of the wafer processing method illustrated in FIG. 15.

A processing method according to a third embodiment of the present invention for a wafer (hereinafter referred to as "the wafer processing method according to the third embodiment") will be described based on the relevant figures of the attached drawings. FIG. 15 is a flowchart illustrating a flow of the wafer processing method according to the third embodiment. FIG. 16 is a cross-sectional view depicting an ultraviolet light application step ST10 of the wafer processing method illustrated in FIG. 15. In FIGS. 15 and 16, the same elements of configurations and steps as in the first embodiment are identified by the same reference signs, and their description is omitted herein.

The wafer processing method according to the third embodiment is the same as that of the first embodiment except that an adhesive tape 11 has a UV light-curable adhesive layer 13 curable when irradiated with ultraviolet light and that the wafer processing method includes an ultraviolet light application step ST10 to be performed after the frame unit forming step ST1 but before the resin sheet providing step ST2.

The adhesive tape 11 for use in the wafer processing method according to the third embodiment is bonded to the wafer 1 and the ring-shaped frame 10, with the UV light-curable adhesive layer 13 interposed therebetween, in the frame unit forming step ST1.

The ultraviolet light application step ST10 applies ultraviolet light to the adhesive layer 13 in a region of the adhesive tape 11, the region being exposed between the ring-shaped frame 10 and the wafer 1, to lower the adhesive force of the adhesive layer 13 exposed between the ring-shaped frame 10 and the wafer 1. As illustrated in FIG. 15, the ultraviolet light application step ST10 is performed after the frame unit forming step ST1 but before the resin sheet providing step ST2. In the present invention, however, the ultraviolet light application step ST10 may also be performed after the resin sheet providing step ST2 but before the resin sheet fixing step ST3.

In the ultraviolet light application step ST10, as depicted in FIG. 16, ultraviolet light 61 is applied from an ultraviolet light source 60 to the entirety of the front side 3 of the wafer 1 so that the ultraviolet light 61 is applied to the adhesive layer 13 in the region of the adhesive tape 11, the region being exposed between the ring-shaped frame 10 and the wafer 1. In the ultraviolet light application step ST10, the adhesive layer 13 is therefore lowered in adhesive force in the region of the adhesive tape 11, the region being exposed between the ring-shaped frame 10 and the wafer 1.

The wafer processing method according to the third embodiment covers the devices 5 by the base material layer 14 of the resin sheet 17, the base material layer 14 being gas impermeable, for the protection of the devices 5 on the wafer 1, thereby preventing the devices 5 from being suctioned and held on the holding surface 22 by a negative pressure acting from the holding surface 22 of the chuck table 21. Further, the wafer processing method according to the third embodiment evacuates, via the through-holes 16, the gas between the resin sheet 17 and the adhesive tape 11, thereby fixing the wafer 1 relative to the chuck table 21. As a consequence, the wafer processing method according to the third embodiment, similarly to the first embodiment, brings about the advantageous effect that the laser beam 33 can be applied from the back side 6 of the wafer 1 while damage to the devices 5 is prevented.

In the wafer processing method according to the third embodiment, ultraviolet light is applied to the adhesive layer 13 in the region of the adhesive tape 11, the region being exposed between the ring-shaped frame 10 and the wafer 1, to lower the adhesive force of the adhesive layer 13, after the frame unit forming step ST1 but before the resin sheet providing step ST2. Therefore, the wafer processing method according to the third embodiment can also bring about the advantageous effect that the adhesive tape 11 and the base material layer 14 of the resin sheet 17 are prevented from bonding with each other, and in the resin sheet separation step ST7, the resin sheet 17 can hence be separated easily.

It is to be noted that the present invention should not be limited to the above-described embodiments. In other words, the present invention can be carried out with a variety of modifications in a scope not departing from the spirit of the present invention. In the present invention, the resin sheet 17 may be formed, for example, with powder or the like of an electrical conductor mixed therein and may hence be provided with electrical conductivity to prevent occurrence of static electricity upon separation of the resin sheet 17 from the chuck table 21 and the wafer 1.

The present invention is not limited to the details of the above-described preferred embodiments. The scope of the invention is defined by the appended claims and all changes and modifications as fall within the equivalence of the scope of the claims are therefore to be embraced by the invention.

What is claimed is:

1. A method for processing a wafer, on a front side of which devices are formed in a plurality of regions defined by intersecting streets, comprising:
a frame unit forming step of bonding an adhesive tape to a ring-shaped frame centrally defining an opening, so that the opening is closed by the adhesive tape, and bonding the wafer at a back side to the adhesive tape to form a frame unit;
a resin sheet providing step of providing a resin sheet that has a diameter greater than that of the opening of the ring-shaped frame and will serve as a protective member for the wafer;
a resin sheet fixing step of covering the opening of the ring-shaped frame with the resin sheet from the front side of the wafer in the frame unit and fixing, at an outer peripheral edge of the resin sheet, the resin sheet on the ring-shaped frame, the resin sheet facing the ring-shaped frame;
a through-hole forming step of forming through-holes in a region of the resin sheet, the region being located on a radially outer side of an outer periphery of the wafer;
a holding step of, after the resin sheet fixing step and the through-hole forming step, using a chuck table that includes a table main body having a holding surface of a diameter greater than that of the wafer and a frame-holding portion configured to pull the ring-shaped frame downward beyond the holding surface on a radially outer side of the table main body and to fix the ring-shaped frame there, and pulling the ring-shaped frame downward and fixing the ring-shaped frame there with the frame-holding portion while holding the frame unit on a side of the resin sheet of the frame unit under suction on the holding surface;
a laser beam application step of, after the holding step, applying a laser beam of a wavelength having transmissivity through the adhesive tape and the wafer to the wafer from a side of the adhesive tape with a condensing point positioned inside the wafer, whereby modified layers are formed along the streets inside the wafer; and
a resin sheet separation step of, after the laser beam application step, separating the resin sheet from the ring-shaped frame, wherein,
in the holding step, the adhesive tape facing the resin sheet is suctioned under a negative pressure acting from the holding surface via the through-holes of the resin sheet while the front side of the wafer is prevented by the resin sheet from being suctioned on the holding surface.

2. The method according to claim 1, wherein
the devices on the wafer are microelectromechanical systems devices.

3. The method according to claim 1, further comprising:
a fracturing step of, after the resin sheet separation step, expanding the adhesive tape in a planar direction to fracture the wafer along the modified layers.

4. The method according to claim 1, wherein
the adhesive tape is bonded to the ring-shaped frame and the wafer, as adherends, via an ultraviolet light-curable adhesive layer, and
the method further includes an ultraviolet light application step of, after the frame unit forming step but before the resin sheet fixing step, applying ultraviolet light to a region of the adhesive tape, the region being exposed between the ring-shaped frame and the wafer, whereby the adhesive layer is lowered in adhesive force.

5. The method according to claim 1, wherein,
in the resin sheet fixing step, the resin sheet is fixed on the ring-shaped frame via an adhesive layer stacked on a region of the resin sheet, the region facing the ring-shaped frame.

6. The method according to claim 1, wherein,
in the resin sheet fixing step, the resin sheet is heated at a region facing the ring-shaped frame, whereby the resin sheet is fixed in close contact with the ring-shaped frame.

7. The method according to claim 2, further comprising:
a fracturing step of, after the resin sheet separation step, expanding the adhesive tape in a planar direction to fracture the wafer along the modified layers.

8. The method according to claim 2, wherein
the adhesive tape is bonded to the ring-shaped frame and the wafer, as adherends, via an ultraviolet light-curable adhesive layer, and
the method further includes an ultraviolet light application step of, after the frame unit forming step but before the resin sheet fixing step, applying ultraviolet light to a region of the adhesive tape, the region being exposed between the ring-shaped frame and the wafer, whereby the adhesive layer is lowered in adhesive force.

9. The method according to claim 2, wherein,
in the resin sheet fixing step, the resin sheet is fixed on the ring-shaped frame via an adhesive layer stacked on a region of the resin sheet, the region facing the ring-shaped frame.

10. The method according to claim 2, wherein,
in the resin sheet fixing step, the resin sheet is heated at a region facing the ring-shaped frame, whereby the resin sheet is fixed in close contact with the ring-shaped frame.

11. The method according to claim 3, wherein
the adhesive tape is bonded to the ring-shaped frame and the wafer, as adherends, via an ultraviolet light-curable adhesive layer, and
the method further includes an ultraviolet light application step of, after the frame unit forming step but before the resin sheet fixing step, applying ultraviolet light to a region of the adhesive tape, the region being exposed between the ring-shaped frame and the wafer, whereby the adhesive layer is lowered in adhesive force.

12. The method according to claim 3, wherein,
in the resin sheet fixing step, the resin sheet is fixed on the ring-shaped frame via an adhesive layer stacked on a region of the resin sheet, the region facing the ring-shaped frame.

13. The method according to claim 3, wherein,
in the resin sheet fixing step, the resin sheet is heated at a region facing the ring-shaped frame, whereby the resin sheet is fixed in close contact with the ring-shaped frame.

14. The method according to claim 4, wherein,
in the resin sheet fixing step, the resin sheet is fixed on the ring-shaped frame via an adhesive layer stacked on a region of the resin sheet, the region facing the ring-shaped frame.

15. The method according to claim 4, wherein,
in the resin sheet fixing step, the resin sheet is heated at a region facing the ring-shaped frame, whereby the resin sheet is fixed in close contact with the ring-shaped frame.

* * * * *